United States Patent

Shone et al.

[11] Patent Number: 5,949,704
[45] Date of Patent: Sep. 7, 1999

[54] STACKED READ-ONLY MEMORY

[75] Inventors: Fu-Chia Shone, Hsinchu, Taiwan; Tom Dang-Hsing Yiu, Milpitas, Calif.

[73] Assignee: Macronix International Co., Ltd., Hsinchu, Taiwan

[21] Appl. No.: 08/983,526

[22] PCT Filed: Sep. 10, 1996

[86] PCT No.: PCT/US96/14685

§ 371 Date: Apr. 2, 1997

§ 102(e) Date: Apr. 2, 1997

[87] PCT Pub. No.: WO98/11607

PCT Pub. Date: Mar. 19, 1998

[51] Int. Cl.$^6$ ............................................. G11C 17/00
[52] U.S. Cl. ........................... 365/104; 365/182; 257/390
[58] Field of Search ...................... 365/104, 51, 63, 365/178, 182, 184; 257/390, 368

[56] References Cited

U.S. PATENT DOCUMENTS

| | | | |
|---|---|---|---|
| 5,017,978 | 5/1991 | Middelhoek et al. | 365/185.16 |
| 5,117,389 | 5/1992 | Yiu | 365/104 |
| 5,383,149 | 1/1995 | Hong | 365/104 |
| 5,644,532 | 7/1997 | Chang | 365/182 |

*Primary Examiner*—Son T. Dinh
*Attorney, Agent, or Firm*—Haynes & Beffel LLP

[57] ABSTRACT

A stacked ROM device utilizes the same conductivity type for the ROM cells in both the top and the bottom ROM cell matrixes. The stacked ROM device comprises a first ROM cell matrix which comprises conductively doped source and drain lines having a first conductivity type in a semiconductor substrate having a second conductivity type. For example, the source and drain lines are implemented with n-type doping in a p-type substrate. A second ROM cell matrix comprises conductively doped source and drain lines having the first conductivity type in a semiconductor layer which overlies and is isolated from the semiconductor substrate. A plurality of shared wordlines is disposed between the first and second ROM cell matrixes. A plurality of bit lines is isolated from and overlies the semiconductor layer. A plurality of matrix select transistors is coupled between the conductively doped source and drain lines in the first ROM cell matrix and the plurality of bit lines, and between the conductively doped source and drain lines in the second ROM cell matrix and the plurality of bit lines, to selectively connect the first ROM cell matrix and the second ROM cell matrix to the plurality of bit lines.

19 Claims, 7 Drawing Sheets

STACKED READ-ONLY MEMORY

BACKGROUND OF THE INVENTION

1. Field of the Invention

The present invention relates to the field of integrated circuit memory; and more particularly high density read-only memory ROM devices.

2. Description of Related Art

ROM devices include an array of ROM cell transistors which permanently store data, such as computer programs, in electronic devices. ROM devices are preferred over other types memory because they provide high density, low cost storage for data which does not need to be changed during the operation of the system incorporating the ROM. One high density read-only memory architecture is described in U.S. Pat. No. 5,117,389 entitled FLAT CELL READ-ONLY INTEGRATED CIRCUIT invented by Yiu, issued May 26, 1992. Other example architectures are described in Millman, MICROELECTRONICS, McGraw-Hill (New York, 1979), Section 9-3, pages 276–283.

The density of ROM cells on an integrated circuit is directly related to the cost of storing data. Thus, the manufacturing techniques for ROM devices have developed to provide higher and higher density architectures. One primary approach to achieving higher density is improvements in manufacturing processes which allow for smaller line widths.

An alternative technique for increasing the density of ROM devices has been proposed in U.S. Pat. No. 5,383,149 entitled "ULSI Mask ROM Structure and Method of Manufacture," invented by Hong, issued Jan. 17, 1995. In the Hong patent, a double-density device is provided by stacking two arrays of ROM cells, with one array above and with one array below a shared wordline array. The bottom array of ROM cells is formed using n-channel transistors, while the top array of ROM cells is formed using p-channel transistors in the Hong design. This use of different conductivity types in the transistors has a number of deficiencies. First, the wordlines must drive different polarities of wordline signals depending on whether the p-channel or n-channel transistor arrays are being sensed. Second, an asymmetry in the design occurs because p-channel transistors are slower than n-channel transistors. Therefore, the n-channel transistor array has a faster access time than the p-channel transistor array, slowing the overall speed of the device. Furthermore, the mask ROM code implant steps used in the two types of array require different materials and processing steps. This increases the complexity, the number of steps and the cost of the manufacturing process.

Accordingly, it is an object of the present invention to provide a high density ROM device, overcoming the disadvantages of the Hong approach, and providing even greater density.

SUMMARY OF THE INVENTION

The present invention provides a stacked ROM device which utilizes the same conductivity type for the ROM cells in both the top and the bottom ROM cell matrixes. This provides substantial advantages by reducing the complexity of the manufacturing process, allowing for dense array architectures, and simplifying the implant steps for coding the stacked ROM cell matrixes.

Accordingly, the present invention can be characterized as a ROM device which comprises a first ROM cell matrix including conductively doped source and drain lines having a first conductivity type in a semiconductor substrate having a second conductivity type. For example, the source and drain lines are implemented with n-type doping in a p-type substrate. A second ROM cell matrix comprises conductively doped source and drain lines having the first conductivity type in a semiconductor layer which overlies and is isolated from the semiconductor substrate. A plurality of shared wordlines is disposed between the first and second ROM cell matrixes. A plurality of bit lines is isolated from and overlies the semiconductor layer. A plurality of matrix select transistors is coupled between the conductively doped source and drain lines in the first ROM cell matrix, and the plurality of bit lines, and between the conductively doped source and drain lines in the second ROM cell matrix and the plurality of bit lines, to selectively connect the first ROM cell matrix and the second ROM cell matrix to the plurality of bit lines.

The plurality of matrix select transistors include a plurality of contact regions in the semiconductor substrate and in the semiconductor layer. The plurality of contact regions are separated from corresponding conductively doped source and drain lines in the semiconductor substrate and in the semiconductor layer by respective select transistor channel regions. Contacts are formed between the contact regions in the semiconductor substrate and corresponding bit lines in the plurality of bit lines, and between the contact regions in the semiconductor layer and corresponding bit lines in the plurality of bit lines. A first matrix select line is formed parallel to the plurality wordlines, and disposed between the first and second ROM cell matrixes. The first matrix select line overlies the select transistor channel regions in the semiconductor substrate, and operates to selectively connect the first ROM cell matrix to the plurality of bit lines. A second matrix select line substantially parallel to the plurality of wordlines is disposed between the first and second ROM cell matrixes, and overlies select transistor channel regions in the semiconductor layer. The second matrix select line is used for selectively connecting the second ROM cell matrix to the plurality of bit lines.

According to one embodiment of the present invention, the conductively doped source and drain lines in the second ROM cell matrix are substantially aligned with, and overlie the conductively doped source and drain regions in the first ROM cell matrix. ROM code implants are accomplished according to this embodiment, in a first mask and implant step for the first ROM cell matrix, and in a second mask and implant step for the second ROM cell matrix.

According to an alternative embodiment, the conductively doped source and drain lines in the second ROM cell matrix are substantially aligned with and overlie the ROM cell channels between the conductively doped source and drain lines in the first ROM cell matrix. According to this embodiment, the ROM cell implants for both the first and second ROM cell matrixes are made using a single mask and implant step, with the implant step involving both higher energy and lower energy implant ions for reaching the first ROM cell matrix and second ROM cell matrix, respectively.

According to yet another aspect of the present invention, the plurality of bit lines includes a shared bit line architecture, in which a shared a bit line is coupled to two conductively doped source and drain lines in each of the first and second ROM cell matrixes. According to the shared bit line architecture, left/right select transistors for selectively connecting one of the two conductively doped source and drain lines in respective first and second ROM cell matrixes to a corresponding bit line, are included. The left/right select transistors in one embodiment comprise ROM cells in the first and second ROM cell matrixes, which are controlled by corresponding left/right select wordlines.

The present invention can also be characterized as a method for manufacturing a read-only memory device which is based on forming a first ROM cell matrix and a second ROM cell matrix, as discussed above with a plurality of shared wordlines disposed between the first and second ROM cell matrices. According to the manufacturing method, code implants are implanted in the first ROM cell matrice using high energy ion implants which penetrate to the first ROM cell matrix without affecting coding of the second ROM cell matrix. Code implants are implanted in the second ROM cell matrix using a lower energy implant process, such that ions do not penetrate to the first ROM cell matrix.

According to one aspect of the invention, a first mask is utilized to define the code implants of the first ROM cell matrix prior to the step of implanting for the first ROM cell matrix. A second mask is used for defining code implants of the second ROM cell matrix prior to the step of implanting for the second ROM cell matrix. The two-step masking process is required when the source and drain diffusion lines of the first and second ROM cell matrices are substantially aligned with one another.

In a staggered embodiment, where the source and drain diffusion regions of the top ROM cell matrix are aligned with and overlie the ROM cell channels in the bottom ROM cell matrix, a single mask step is utilized for defining the code implants of the top and bottom ROM matrices prior to the steps of implanting. Furthermore, the implanting step according to this aspect of the invention, is executed using a single dual energy implant process.

According to other aspects of the present invention, the plurality of wordlines comprise conductively doped polysilicon. Further, the semiconductor layer comprises polysilicon, and the plurality of bit lines comprises metal.

The present invention can also characterized as a read-only ROM device comprising a first semiconductor layer having a first conductivity type, such as a semiconductor substrate. A first plurality of conductively doped regions in the first semiconductor layer are elongated in a first direction and spaced apart from one another by channel regions. The plurality of conductively doped regions have a conductivity type opposite to the conductivity type of the first semiconductor layer. A first gate insulating layer is formed over the first semiconductor layer. A plurality of wordlines on the first gate insulating layer are elongated in a second direction different from the first direction, so that the plurality of wordlines and the first plurality of conductively doped regions establish a first matrix of ROM cells. A second gate insulating layer is placed over the plurality wordlines. A second semiconductor layer having the same conductivity type as the first semiconductor layer is formed over the second gate insulating layer. A plurality of conductively doped regions in the second semiconductor layer are elongated in the first direction and spaced apart from one another by channel regions. The second plurality of conductively doped regions have the same conductivity type as the first plurality of conductively doped regions in the first semiconductor layer. Thus, said plurality of wordlines and said second plurality of conductively doped regions establish a second matrix of ROM cells over the first matrix of ROM cells. ROM code implants in selected ROM cells in the first and second matrixes of ROM cells establish a data pattern in the first and second matrixes. A plurality of bit lines is isolated from and overlies the second semiconductor layer. A plurality of matrix select transistors is coupled between the first and second plurality of conductively doped regions and the plurality of bit lines to selectively connect the first matrix of ROM cells and the second matrix of ROM cells to the plurality of bit lines.

As discussed above, the architecture of a read-only memory device according to this characterization of the invention also provides in one alternative implementation for staggered conductively doped regions in the first and second matrixes of ROM cells, allowing for a single mask and implant step for establishing the ROM code implants in the device. Also, a shared bit line architecture using left and right select transistors is implemented according to this characterization of the invention.

Other aspects and advantages of the present invention can be seen upon review of the figures, the detailed description and the claims which follow.

DETAILED DESCRIPTION

Figure 1:
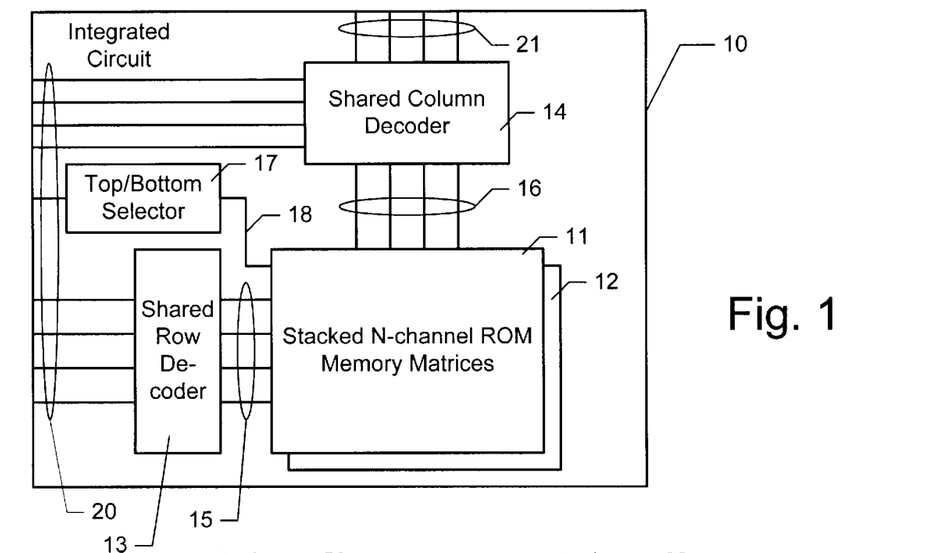
FIG. 1 is a simplified block diagram of the stacked ROM integrated circuit according to the present invention.

A detailed description of preferred embodiments of the present invention is provided with respect to FIGS. 1 through 12. FIG. 1 provides a simplified diagram of an integrated circuit ROM device according to the present invention. Thus, the device includes an integrated circuit substrate 10. On the substrate 10, stacked n-channel ROM memory matrixes 11 and 12 are implemented. A shared row decoder 13 and a shared column decoder 14 are coupled to the stacked memory matrixes 11, 12 by means of wordlines 15 and bit lines 16 respectively. A top and bottom matrix selector 17 is also coupled to the stacked memory matrixes 11, 12 by means of a top/bottom select line 18. Preferred embodiments, the top/bottom select 18 comprises a two bit bus as discussed in more detail below. Address bits 20 are supplied to the shared column decoder 14, the top/bottom selector 17, and the shared row decoder 13 for the purpose of selecting memory cells in the stacked memory matrixes 11, 12. A data bus 21 is coupled to the shared column decoder 14 providing an output data path for the stacked memory matrixes 11, 12.

In the embodiment shown in FIG. 1, the stacked memory matrixes 11, 12 are implemented with n-channel ROM cells. Alternative systems, the stacked memory matrixes 11, 12 are implemented with p-channel ROM cells. In either case, the same conductivity type is used for both memory matrixes 11, 12 according to the present invention. By utilizing the same conductivity type, the polarity of the wordlines 15 is the same for access to both matrixes. Also, the materials used for the ROM code implant are the same. Furthermore, the respective speeds of access to the separate matrixes of ROM cells are much closer, than in the prior art approach discussed above with respect to U.S. Pat. No. 5,383,149. Furthermore, the architecture according to the present invention provides a number of density enhancements as described in more detail below.

Figure 2:
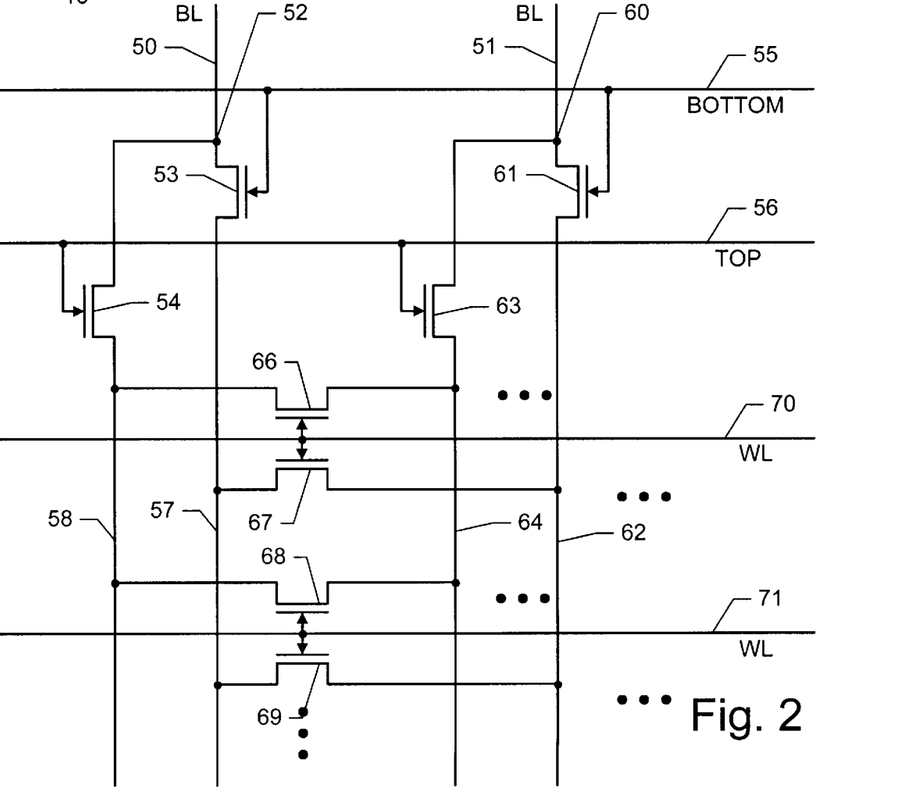
FIG. 2 is a simplified circuit diagram of a stacked ROM circuit according to one implementation of the present invention.

FIG. 2 provides a simplified schematic diagram, illustrating certain features of the stacked n-channel ROM memory matrixes 11, 12 of FIG. 1. According to the architecture, a metal bit line 50 and a metal bit line 51, are each coupled to a column of cells in the top matrix and a column of cells in the bottom matrix. The metal bit line 50 is coupled to a metal to diffusion contact point 52. The metal to diffusion contact point 52 is coupled to a contact diffusion region in the bottom matrix which acts as one of the source or drain of bottom select transistor 53. The opposite terminal of transistor 53 is coupled to a source or drain diffusion line 57. Also, the metal contact 52, is coupled (possibly by a separate contact structure) to a diffusion region in the top matrix which acts as one of the source and drain of top select transistor 54. The opposite terminal of transistor 54 is coupled to a source or drain diffusion line 58 on the top matrix. A bottom select wordline 55 and a top select wordline 56 are coupled to the gates of transistors 53 and 54 respectively.

In a similar structure, bit line 51 is coupled to a diffusion to metal contact 60. The diffusion to metal contact 60 is coupled to a diffusion region in the bottom matrix which corresponds to one of the source and drain of transistor 61. The opposite terminal transistor 61 is coupled to a source or drain line 62 on the bottom matrix. Also, the metal to diffusion contact 60 is coupled (possibly by a separate contact structure) to a diffusion region corresponding to one of the source and drain of top select transistor 63. The opposite terminal of top select transistor 63 is coupled to a source or drain diffusion line 64 on the top matrix. The bottom select wordline 55 is coupled to the gate of bottom select transistors 53 and 61. The top select wordline 66 is coupled to the gate of top select transistors 54 and 63.

A column of ROM cells is formed between the source or drain diffusion lines 58 and 64 on the top matrix. The column of ROM cells in the top matrix includes ROM cell 66 and ROM cell 68 in the diagram. A column of ROM cells is also formed between the source or drain diffusion lines 57 and 62 in the bottom matrix. The column of cells in the bottom matrix includes transistors 67 and 69 in the diagram. Wordlines 70 and 71 are shared between the top and bottom arrays. Thus, wordline 70 is connected to the gates of transistor 66 in the top array and transistor 67 in the bottom array. Similarly, wordline 71 is connected to the gates of transistor 68 in the top array and transistor 69 in the bottom array.

Thus, as can be seen with reference to FIGS. 1 and 2, a bottom ROM cell matrix 12 including transistors 67 and 69 in FIG. 2, is formed in the substrate having a first conductivity type, such as n-channel. The top ROM cell matrix 11 including transistors 66 and 68 in FIG. 2, is formed having the same conductivity type as the bottom matrix. Wordlines 70 and 71 are shared between the top and bottom matrixes. Furthermore, the polarity of the wordline used when accessing the bottom matrix is the same as that used when accessing the top matrix, because both matrixes are implemented with the same conductivity type of ROM cell. In order to access a selected transistor, a bit line is selected, a wordline is selected, and a top or bottom array is selected using the decoding circuitry as illustrated in FIG. 1.

The transistors 66 through 69 in the top and bottom matrixes are implanted with ROM code implants in a pattern which establishes the data to be read from the ROM. Thus, transistors having a ROM code implant do not conduct in response to a read potential on the wordline, while transistors which do not have the implant do conduct in response to a read potential on the wordlines, or visa-versa.

More details concerning the operation of the circuits can be understood in light of the manufacturing processes and the structure of the cells, described in more detail below.

Figure 3:
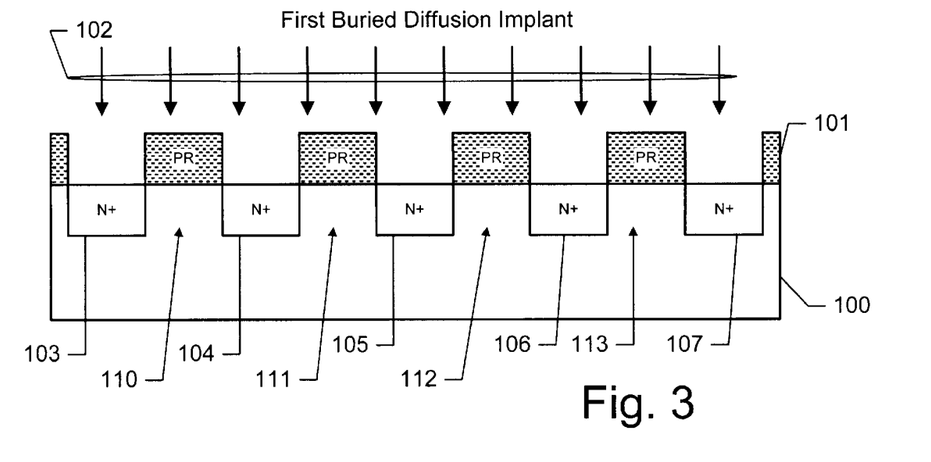
FIG. 3 through FIG. 7 illustrate a process for manufacturing the stacked ROM device according to the present invention involving separate ROM code implant steps for the top and bottom matrices of ROM cells.

FIGS. 3 through 7 illustrate a manufacturing process for a stacked ROM device according to one embodiment of the present invention. In FIG. 3, the establishment of buried diffusion source and drain lines in the semiconductor substrate to act as a first ROM cell matrix is shown. Thus, a substrate 100 is provided. A pattern of photoresist generally 101 is formed on the surface of the substrate 100 to establish a plurality of parallel source and drain lines which are spaced away from one another. A buried diffusion implant step represented by arrows 102 is executed over the photoresist mask 101. In one embodiment, n+dopants such as arsenic, phosphorous or antimony are used for the implant step. This results in buried diffusion source and drain lines 103 through 107 in the substrate 100. The source and drain lines 103 through 107 are spaced apart from one another by the photoresist mask 101 to establish channel regions 110 through 113. In one embodiment, an additional layer of material such as tungsten silicide is formed over the buried diffusion regions 103 through 107, in order to reduce the resistivity of the conductively doped buried diffusion regions to the range of about 40 to 60 ohm-centimeters.

Figure 4:
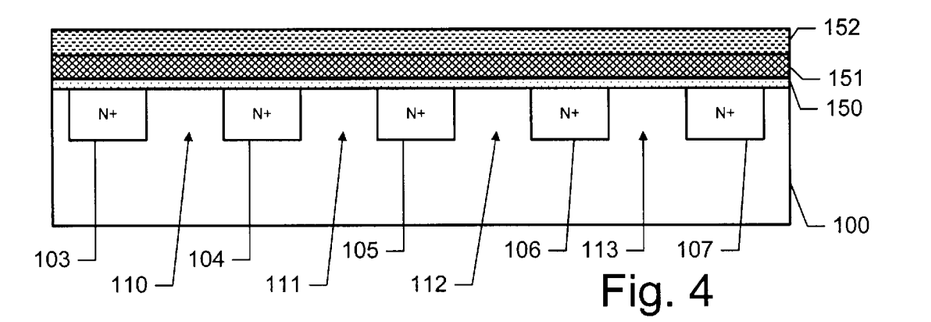

FIG. 4 is used to illustrate following process steps. Thus, the substrate 100 including the source or drain diffusion lines 103 through 107 is shown. A gate oxide 150 is formed over the substrate using for example, a thermal or a chemical vapor deposition CVD oxide growth technique. Because of the different oxidation growth rates over the doped diffusion regions 103 through 107 and the more lightly doped channel regions, the gate oxide 150 is thicker over the diffusion regions, than over the channel regions (not shown in the figure) for most oxide growth techniques.

Over the gate oxide 150, a conductively doped polysilicon layer 151 is formed. A photoresist mask 152 is then formed over the polysilicon layer 151, in a pattern to define wordlines which are orthogonal to the source and drain diffusion lines 103 through 107.

Figure 5:
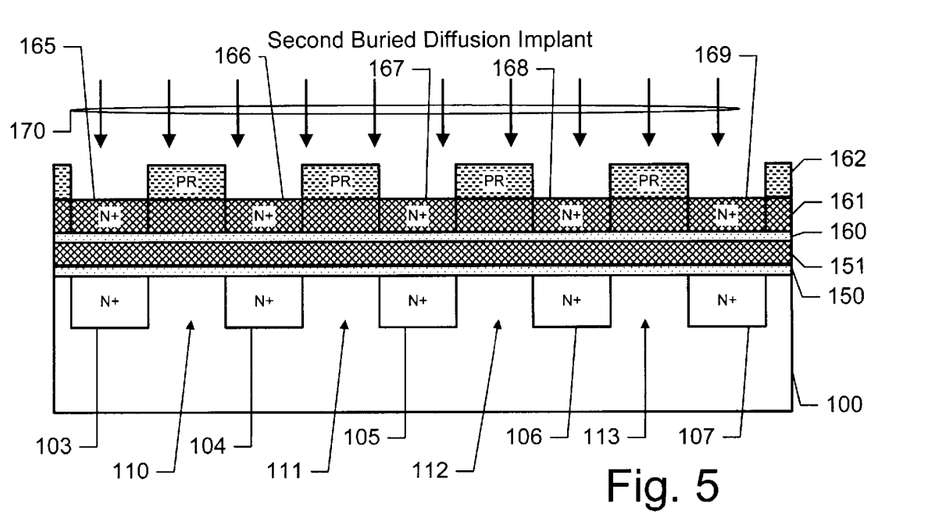

FIG. 5 illustrates subsequent processing steps after FIG. 4. Thus, structures of FIG. 4 which remain in FIG. 5 have the same reference numbers. After the patterning step of FIG. 4, the photoresist layer 152 is removed, and a second gate oxide 160 is formed over the wordline structures 151, using a high temperature thermal oxide or a CVD oxide process. The oxide 160 acts as a gate dielectric for the top array of ROM cell transistors. The high temperature oxide process has a number of advantages over conventional low temperature CVD, although either technique could be utilized. Also, high temperature CVD processes are available which provide high quality oxides.

After formation of the top gate dielectric 160, a layer of lightly doped p-type polysilicon 161 is deposited on the structure. After deposition of the layer 161, a photoresist mask 162 is formed over the polysilicon layer 161 in a pattern to define source and drain diffusion lines in the polysilicon layer 161. The source and drain diffusion lines 165 through 169 are formed using a second buried diffusion implant process represented by arrows 170.

The second buried diffusion implant 170 is accomplished using n-type dopants such as arsenic, phosphorous or antimony, like the buried diffusion implants 102 used for the source and drain diffusion lines 103 through 107 in the bottom matrix.

After removal of the photoresist mask 162, implantation of the ROM code implants, passivation, contact and metalization layers are executed to complete the device. As can be seen in FIG. 5, the source and drain diffusion lines in the polysilicon layer 161 in the top matrix, and the source and drain diffusion lines 103 through 107 in the semiconductor substrate 100 of the bottom matrix are substantially aligned with and overlie one another so that straight metal lines can be utilized for the bit lines as described with reference to FIG. 8.

Figure 6:
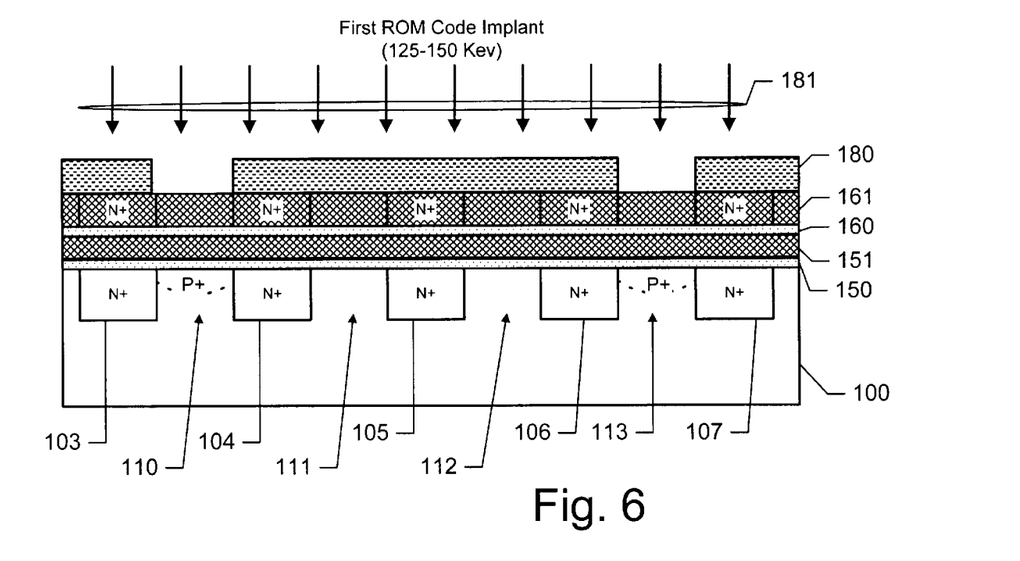

FIG. 6 shows the first ROM code implant step for the bottom matrix. In FIG. 6, the structures of FIG. 5 are given like reference numbers. As can be seen, in FIG. 6 a photoresist mask 180 is deposited over the polysilicon layer 161. The photoresist mask 180 covers the channel regions between the source and drain lines 103 to 107 in the semiconductor substrate which are to be protected from the ROM code implant. Thus, the channel region 110 and the channel region 113 are exposed by the mask 180. A relatively high energy implant process, such as in the range of 125 to 150 Kev, is utilized to implant p-type code implants into the channel regions 110 and 113. The high energy implant does not lodge in the channel regions in the polysilicon layer 161. P-type dopants are used, such as boron, for the purposes of the ROM code implants in the channel regions 110 and 113.

Figure 7:
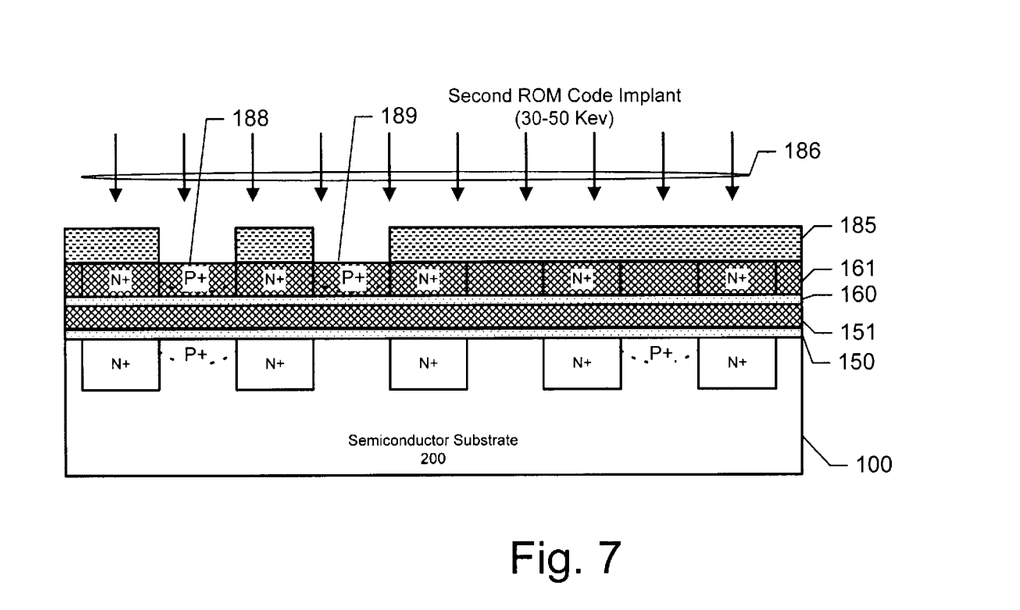

As can be seen in FIG. 7, a second mask step is used for forming ROM code implants in the top matrix. Thus, a photoresist mask 185 is formed over the polysilicon layer 161 (after the removal of the mask 180 of FIG. 6). The mask 185 exposes the channel regions between the source and drain lines of the polysilicon layer 161 to a lower energy ROM code implant process represented by arrows 186. The lower energy implant, such as at 30 to 50 Kev, is used to establish the code implants in the polysilicon layer 161, without reaching through the wordline polysilicon into the semiconductor substrate 100. Thus, the channel regions 188 and 189 receive ROM code implants in the illustration of FIG. 7.

The ROM code implants in the channel regions 188 and 189, and in the channel regions 110 and 113 raise the threshold voltage of the subject ROM cells, so that they do not conduct in response to a read voltage on the wordline polysilicon 151.

According to the process of FIG. 3 through FIG. 7, the ROM code implant steps are accomplished after formation of the semiconductor layer 161 formed of polysilicon, and after implantation of the source and drain lines in that layer. Thus, the partially manufactured ROM cells can be completed with relatively few process steps, allowing time to delivery of coded ROM devices to be reduced.

Figure 8:
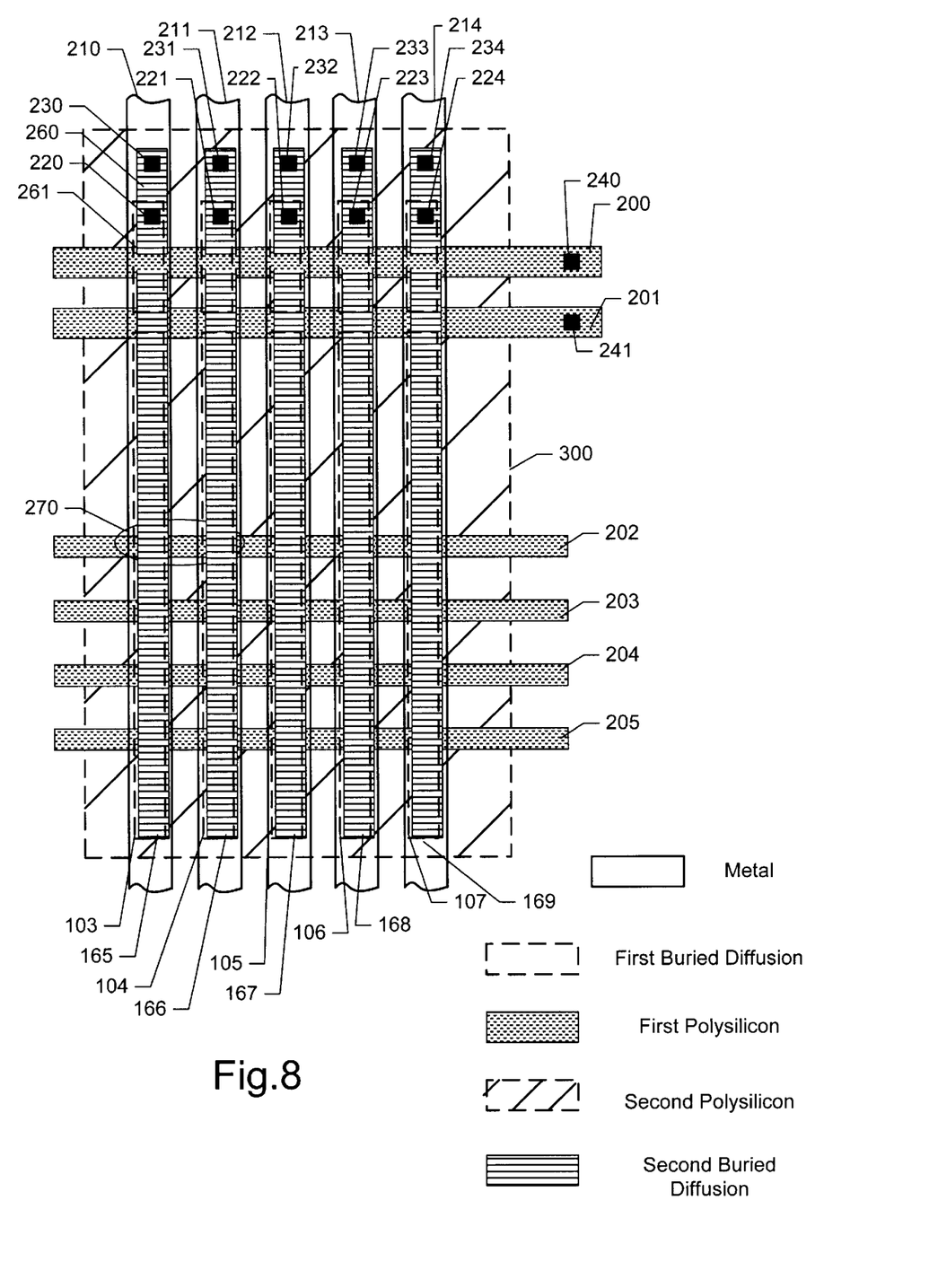
FIG. 8 is a layout diagram for the stacked ROM architecture according to the present invention in which there is one metal bit line for each column of cells.

FIG. 8 provides a top layout view of a stacked matrix ROM device manufactured according to the processes of FIG. 3 through FIG. 7. Thus, the diagram illustrates the first buried diffusion regions 103 through 107 in the substrate, the polysilicon word lines 200 through 205 which are implemented in the polysilicon layer 151, the second buried diffusion lines 165 through 169 which are implemented in the second polysilicon layer 161, and metal bit lines 210 through 214 which overlie the structure. Shading for each of the layers is shown in the diagram, with the exception of the metal lines which overlie the structure.

The top and bottom select lines are implemented by lines 200 and 201 in the wordline polysilicon layer 151. Contacts 240 and 241 are shown in the diagram illustrating that metal to polysilicon contacts can be utilized for providing a path for control signals on the top and bottom select lines 200 and 201.

The structure of the top and bottom select transistors is also shown. The contact 230 is coupled with a diffusion region 260 in the polysilicon layer 300. The diffusion region 260 is spaced away from the diffusion region 103 by a channel region which underlies the top select line 200. In a similar manner, the contact 220 is coupled to a diffusion region 261 in the semiconductor substrate which is spaced away from the diffusion region 103 by a channel area which underlies the bottom select line 201. Similar structures are formed with the contacts 221 through 224 to diffusion regions in the substrate and 231 through 234 to diffusion regions in the polysilicon layer 300 establishing the top and bottom select transistors (corresponding to transistors 53, 54 and 61, 63 of FIG. 2).

ROM cells in both the top and bottom matrices are formed in regions, such as region 270. The region 270 extends between source and drain lines in the bottom array 103 and 104, and underneath a wordline 202. Also, a ROM cell in the region 270 is formed between the source and drain lines 165 and 166 in the top array, and overlying the wordline 202.

Figure 9:
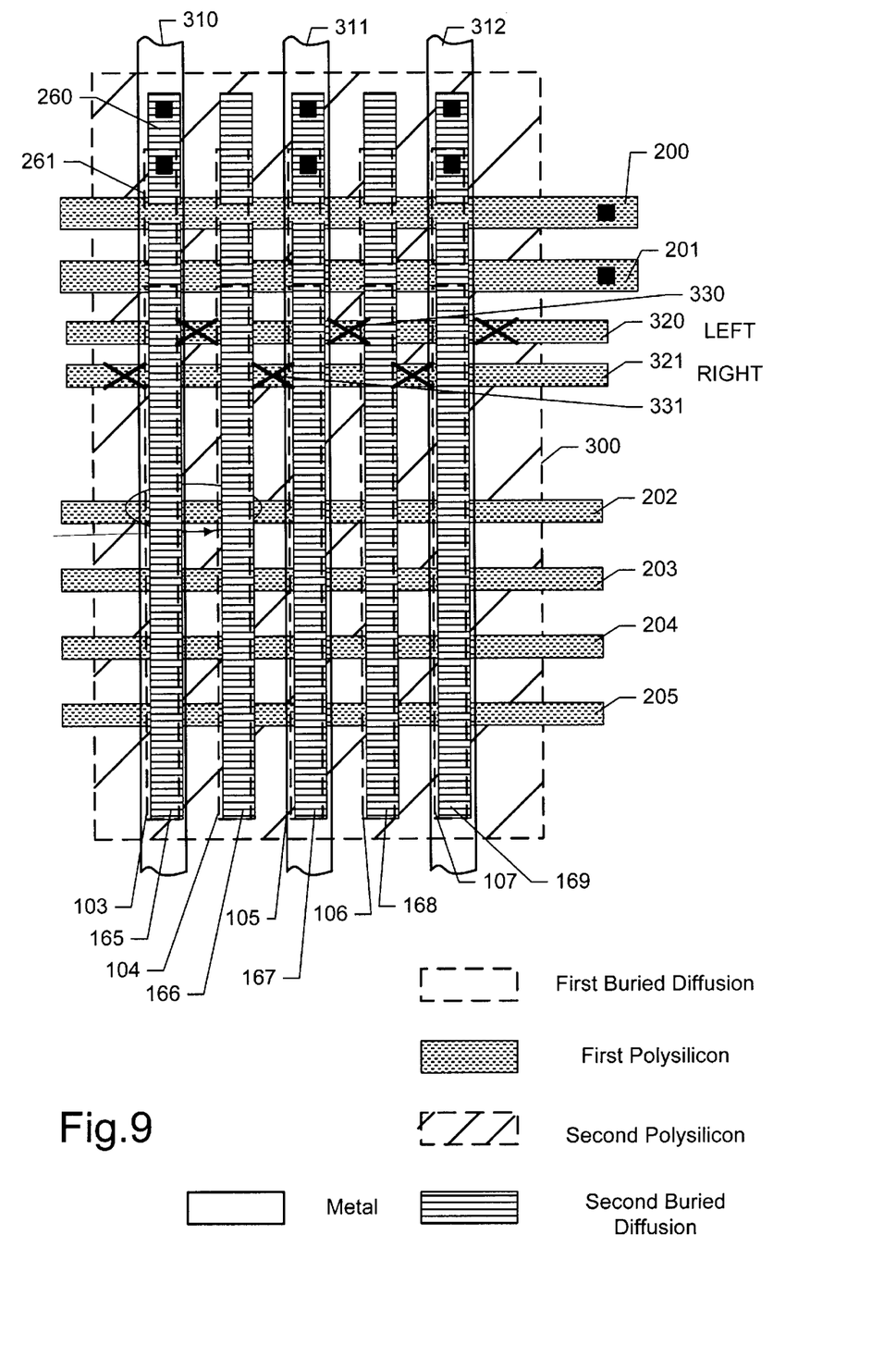
FIG. 9 is a layout diagram for a ROM architecture according to the present invention in which there is a shared metal bit line for each two columns of cells.

FIG. 9 illustrates an alternative layout which allows for a denser array, based on the use of shared metal bit lines, in a manner such as described in U.S. Pat. No. 5,117,389. Thus, the structures in FIG. 9 are given similar reference numbers to those of FIG. 8 where appropriate. In the architecture of FIG. 9, metal lines 310, 311 and 312 are shared between two columns of cells. In order to establish the sharing, left and right select lines 320 and 321 are formed in the wordline polysilicon layer. ROM cells established above and below the left and right select lines 320 and 321, receive ROM code implants in a pattern which establishes a connection between the buried diffusion source or drain line 105, 167 under the metal line, e.g. metal line 311, and a buried diffusion source or drain line 166, 104 on the left, and a buried diffusion source or drain line 106, 168 on the right. This provides for sharing two columns of cells on each of the top and bottom matrices with a single metal line 311. Thus, ROM code implants 330 to the right of metal line 311, and ROM code implants 331 to the left of metal line 311 in the top and bottom matrices are established. In response to the left select bit line 320 receiving a read potential, the metal line of the selected one of the top and bottom matrices is coupled to the buried diffusion 104 or 166. In a similar fashion, in response to the right select wordline 321 receiving a read potential, the metal line 311 is coupled to the selected one of the top and bottom diffusion lines 106 and 168 to the right. The diffusion lines 105 and 167 are coupled to the metal line 3 11 through the respective top and bottom select transistors.

The left and right decoding shown in FIG. 9 establishes a more dense array architecture because of the fewer number of metal lines, and metal to diffusion contacts required.

Figure 10:
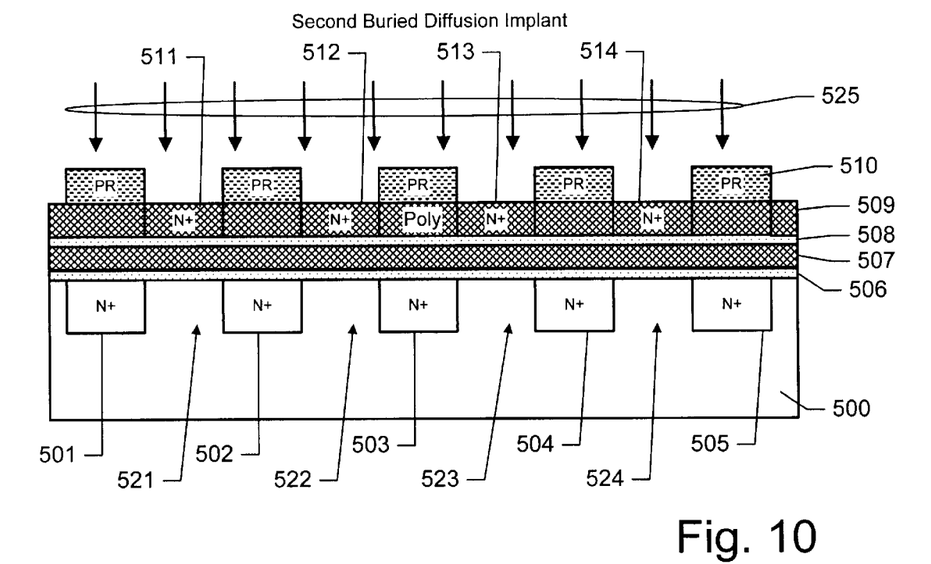
FIG. 10 and FIG. 11 illustrate alternative manufacturing steps according to the present invention in which the source and drain lines in the top layer are staggered relative to the source and drain lines in the bottom layer.
Figure 11:
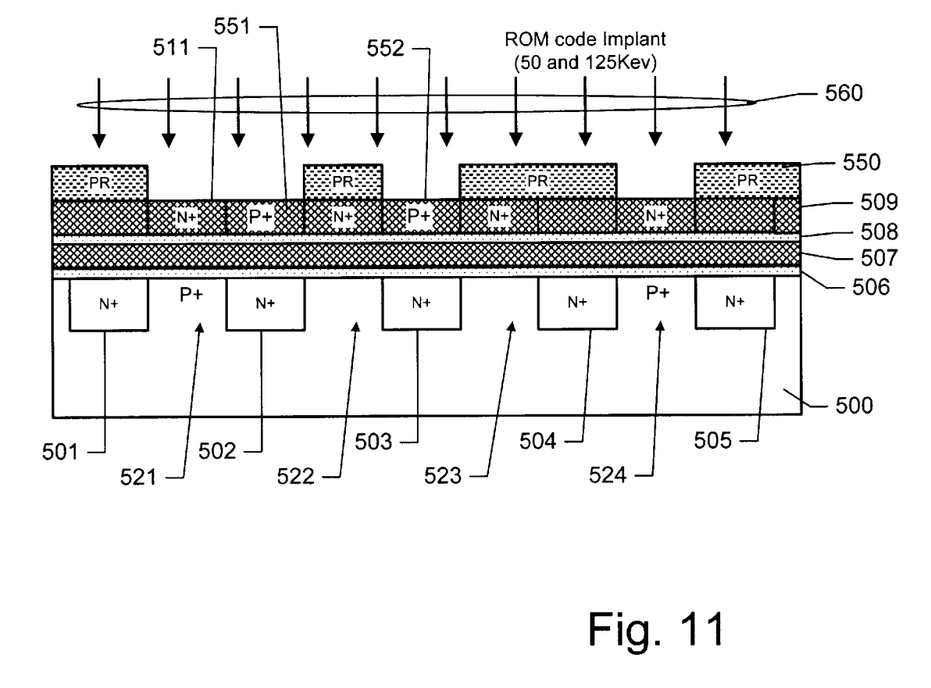

FIGS. 10 and 11 illustrate an alternative embodiment of the present invention, based on the use of staggered source and drain diffusion lines, which enable the ROM code implants to be accomplished in a single mask step.

The process for the staggered matrices includes the steps illustrated in FIG. 3 and FIG. 4. Thus, source and drain diffusion lines 501 through 505 are formed in a semiconductor substrate 500. The gate oxide layer 506 is formed over the substrate 500 (with thicker regions over the source and drain diffusion lines 501 through 505 as discussed above although not shown in the figure). Wordline polysilicon 507 is formed and patterned over the gate oxide 506. On top of the polysilicon 507, a second gate oxide 508 is formed. Then, a layer of semiconductor, such as polysilicon 509 is formed over the top gate oxide 508. A source and drain implant photoresist layer 510 is deposited and patterned over the semiconductor layer 509, in order to establish source and drain lines 511 through 514 which are over and substantially aligned with the channel regions 521 through 524 in the substrate 500. By "substantially" aligned it is meant that some misalignment is tolerable, so long as the following ROM code implant process remains reliable. A buried diffusion implant represented by the arrows 525 establish n-type doping in the source and drain diffusion lines 511 through 514 in the semiconductor layer 509. Thus, the source and drain lines in the semiconductor 509 are staggered with respect to the source and drain lines in the semiconductor substrate 500.

After defining the staggered source and drain lines on the top and bottom matrices, as shown in the FIG. 11, a ROM code photoresist layer 550 is deposited and patterned over the semiconductor layer 509. The pattern 550 is formed so as to expose channel regions 521 and 524 in the substrate 500, as well as channel regions 551 and 552 in the semiconductor layer 509.

A ROM code implant process represented by arrows 560 is executed using higher energy and lower energy ions, such as ions at 30–50 Kev and at 125–150 Kev. The higher energy ions penetrate into the channel regions 521 and 524. The lower energy ions are trapped in the channel regions 551 and 552 in the top ROM cell matrix. The higher energy ions which reach buried diffusion lines, such as line 502, in the substrate 500 do not substantially impact the conductivity of the diffusion line. Similarly, implants trapped in the buried diffusion lines such as buried diffusion line 511 in the semiconductor layer 509, do not substantially impact the conductivity of the diffusion line. Thus, a single mask 550 is utilized to accomplish the code implant for both the top and bottom matrices, according to the embodiment illustrated with respect FIG. 10 and FIG. 11.

Figure 12:
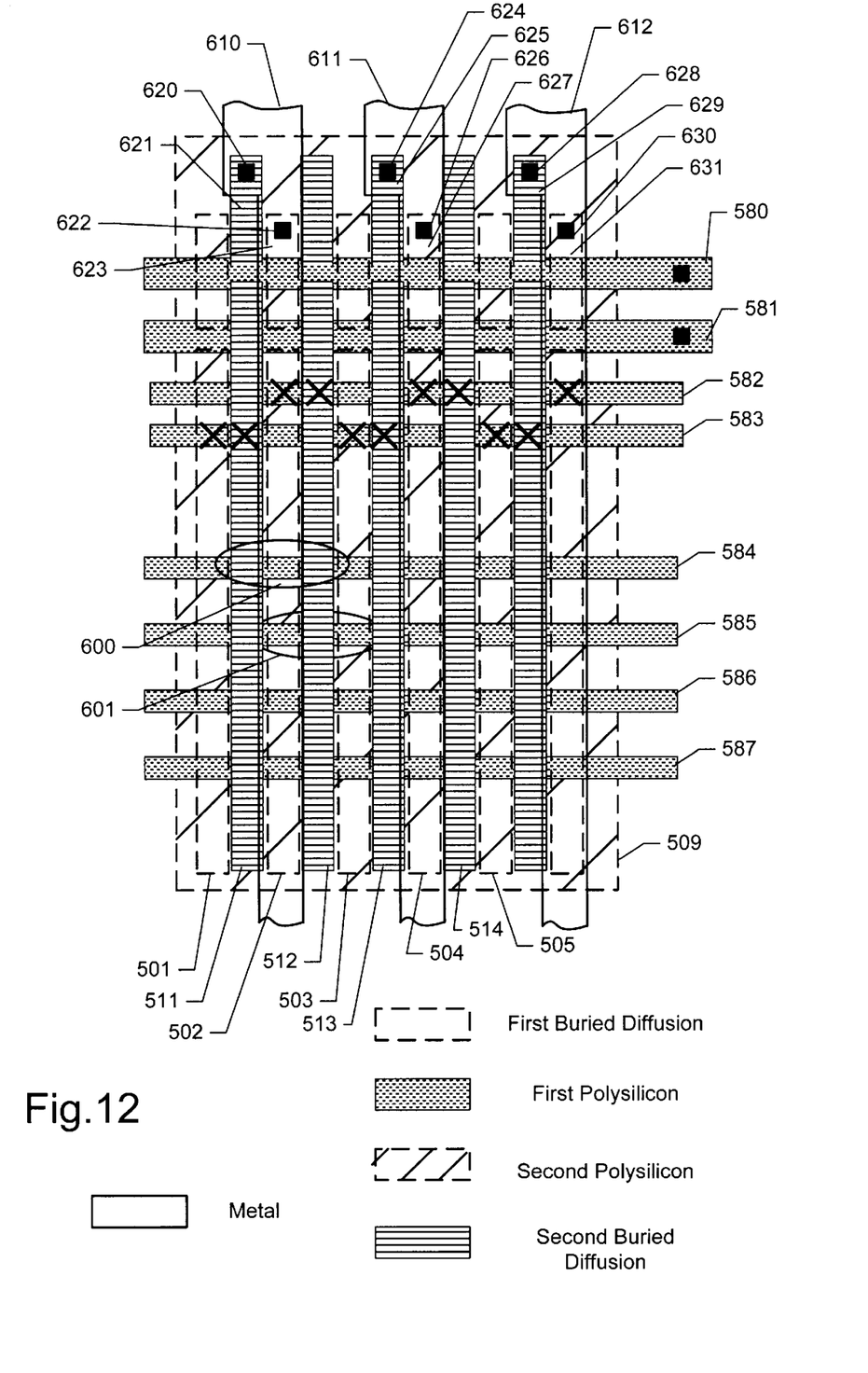
FIG. 12 is a layout diagram for the staggered matrices manufactured as shown in FIG. 10 and FIG. 11.

FIG. 12 is a layout diagram for the embodiment of FIGS. 10 and 11 using staggered source and drain diffusion lines. The layout diagram of FIG. 12 is drawn with the same convention as FIGS. 8 and 9. Thus, the buried diffusion lines 501 through 505 are illustrated which are formed in the semiconductor substrate. Buried diffusion lines 511 through 514 are formed in the second polysilicon layer 509. ROM cells in the top layer are formed in regions like the region 600 between the diffusion lines 511 and 512 over the wordline 584. ROM cells in the bottom layer are formed in regions like the region 601, which establishes a ROM cell between diffusion lines 502 and 503 under wordline 585.

The wordline polysilicon layer includes the top and bottom select lines 580 and 581 respectively. Also, in the embodiment illustrated, left/right select lines 582 and 583 are implemented. The array wordlines 584 through 587 extend orthogonal to the source and drain diffusion lines in the top and bottom arrays as shown in the Figure.

Metal lines 610, 611 and 612 overlie the structure, and are implemented to support the shared metal line structure which was discussed with reference to FIG. 9. However, the metal lines 610, 611 and 612 are widened in order to accommodate the staggered contacts 620, 622, 624, 626, 628, 630. Thus, a metal to diffusion contact 620 is connected between the metal line 610 and the contact diffusion 621. The contact diffusion 621 spaced from the source or drain line 511 by a channel area underneath the top select line 580. Contact 622 extends from the contact diffusion 623 in the substrate to the metal line 610. The contact diffusion 623 is spaced from the source drain line 502 by a channel area which underlies the bottom select line 581. The contact 624 and contact diffusion 625 establish a top select transistor with the top select line 580. Contact 626 and contact diffusion 627 establish a bottom select transistor with the bottom select line 581. Contact 628 and contact diffusion 629 establish a top select transistor with top select 580, and contact 630 and contact diffusion 63 1 establish a bottom select transistor with the bottom select line 581.

The left and right select lines 582 and 583 have ROM code implants which are staggered, and implemented in the pattern shown by the "X" marks in FIG. 12. Thus, shared metal lines 610, 611 and 612 are provided in a staggered array architecture of FIG. 12. A very high density ROM using top and bottom ROM cell matrices is provided according to the embodiment of FIGS. 10 through 12, in which the ROM code implants for both layers are established in a single masking step. This further improves the turn-around time of ROM devices implemented with the stacked structure of the present invention over the embodiments of FIGS. 8 and 9.

In summary, the present invention provides a stacked ROM architecture in which the ROM cell matrix on the top has the same conductivity type as the ROM cell matrix on the bottom, allowing use of shared wordlines with the same polarity signal for both the top and bottom matrices. Also, the use of the same conductivity type in both matrices provides for more uniform access speed for the matrices than possible in the prior art, which relies on opposite polarities in the top and bottom matrices. Furthermore, the ROM code implant processes used for the top and bottom matrices are similar, making manufacturing of the stacked ROM more practical and cost effective than prior art devices. Using a staggered bit line approach allows use of a single implant mask for both layers of cells. Finally, high density enhancements to the stacked ROM architecture are provided based on the use of shared metal lines, and other techniques disclosed in the application.

The present invention comprises a novel method and apparatus for Stacked Read-Only Memory. The foregoing description is presented to enable any person skilled in the art to make and use the invention. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiment shown, but is to be accorded the widest scope consistent with the principles and features disclosed herein.

We claim:

1. A read only memory ROM device, comprising:
    a first ROM cell matrix comprising conductively doped source and drain lines having a first conductivity type in a semiconductor substrate;
    a second ROM cell matrix comprising conductively doped source and drain lines having the first conductivity type in a semiconductor layer overlying and isolated from the semiconductor substrate;

a plurality of shared word lines disposed between the first and second ROM cell matrices; and a plurality of bit lines isolated from and overlying the semiconductor layer and coupled with the first and second ROM cell matrices.

2. The ROM of claim 1, including:

a plurality of matrix select transistors coupled between the conductively doped source and drain lines in the first ROM cell matrix and the plurality of bit lines, and between the conductively doped source and drain lines in the second ROM cell matrix and the plurality of bit lines, to selectively connect the first ROM cell matrix and the second ROM cell matrix to the plurality of bit lines.

3. The ROM of claim 2, wherein the plurality of matrix select transistors include:

a plurality of contact regions in the semiconductor substrate and in the semiconductor layer, the plurality of contact regions separated from corresponding conductively doped source and drain lines in the semiconductor substrate and in the semiconductor layer by respective select transistor channel regions;

a plurality of contacts between the contact regions in the semiconductor substrate and corresponding bitlines in the plurality of bitlines, and between the contact regions in the semiconductor layer and corresponding bitlines in the plurality of bitlines;

a first matrix select line substantially parallel to the plurality of word lines, disposed between the first and second ROM cell matrices, and overlying select transistor channel regions in the semiconductor substrate; and a second matrix select line substantially parallel to the plurality of word lines, disposed between the first and second ROM cell matrices, and overlying select transistor channel regions in the semiconductor layer.

4. The ROM of claim 1, wherein the conductively doped source and drain lines in the second ROM cell matrix are substantially aligned with, and overlying, the conductively source and drain lines in the first ROM cell matrix.

5. The ROM of claim 1, wherein the conductively doped source and drain lines in the second ROM cell matrix are substantially aligned with, and overlying, ROM cell channels between the conductively doped source and drain lines in the first ROM cell matrix.

6. The ROM of claim 1, wherein said plurality of bit lines includes a shared bit line coupled to two conductively doped source and drain lines in each of the first and second ROM cell matrices, and including left/right select transistors for selectively connecting one of the two conductively doped source and drain lines in respective first and second ROM cell matrices to a corresponding bit line.

7. The ROM of claim 6, wherein the left/right select transistors comprise ROM cells in the respective first and second ROM cell matrices.

8. The ROM of claim 1, wherein the plurality of word lines comprise polysilicon.

9. The ROM of claim 1, wherein the semiconductor layer comprises polysilicon.

10. The ROM of claim 1, wherein the plurality of bit lines comprise metal.

11. A read only memory ROM device, comprising:

a first semiconductor layer having a first conductivity type;

a first plurality of conductively doped regions in the first semiconductor layer elongated in a first direction and spaced apart from one another, the first plurality of conductively doped regions having a second conductivity type;

a first gate insulating layer on the first semiconductor layer;

a plurality of word lines on the first gate insulating layer elongated in a second direction different from the first direction, wherein said plurality of word lines and said first plurality of conductively doped regions establish a first matrix of ROM cells;

a second gate insulating layer on the plurality of word lines;

a second semiconductor layer having a first conductivity type on the second gate insulating layer;

a second plurality of conductively doped regions in the second semiconductor layer elongated in the first direction and spaced apart from one another, the second plurality of conductively doped regions having the second conductivity type, wherein said plurality of word lines and said second plurality of conductively doped regions establish a second matrix of ROM cells over the first matrix of ROM cells;

ROM code implants in selected ROM cells in the first and second matrices of ROM cells;

a plurality of bit lines isolated from and overlying the second semiconductor layer; and a plurality of matrix select transistors coupled between the first and second plurality of conductively doped regions and the plurality of bit lines to selectively connect the first matrix of ROM cells and the second matrix of ROM cells to the plurality of bit lines.

12. The ROM of claim 11, wherein the plurality of matrix select transistors include:

a plurality of contact regions in the first semiconductor layer and in the second semiconductor layer, the plurality of contact regions separated from corresponding conductively doped regions in the first semiconductor layer and in the second semiconductor layer by respective select transistor channel regions;

a plurality of contacts between the contact regions in the first semiconductor layer and corresponding bitlines in the plurality of bitlines, and between the contact regions in the second semiconductor layer and corresponding bitlines in the plurality of bitlines;

a first matrix select line substantially parallel to the plurality of word lines, between the first and second gate insulating layers, and overlying select transistor channel regions in the first semiconductor layer; and a second matrix select line substantially parallel to the plurality of word lines, between the first and second gate insulating layers, and overlying select transistor channel regions in the second semiconductor layer.

13. The ROM of claim 11, wherein the conductively doped regions in the second plurality of conductively doped regions are substantially aligned with, and overlying, the conductively doped regions in the first plurality of conductively doped regions.

14. The ROM of claim 11, wherein the conductively doped regions in the second plurality of conductively doped regions are substantially aligned with, and overlying, ROM cell channels between the conductively doped regions in the first plurality of conductively doped regions.

15. The ROM of claim 11, wherein said plurality of bit lines includes a shared bit line coupled to two conductively doped regions in each of the first and second semiconductor layers, and including left/right select transistors for selectively connecting one of the two conductively doped regions in respective first and second semiconductor layers to a corresponding bit line.

16. The ROM of claim 15, wherein the left/right select transistors comprise ROM cells in the respective first and second matrices.

17. The ROM of claim 11, wherein the plurality of word lines comprise polysilicon.

18. The ROM of claim 11, wherein the semiconductor layer comprises polysilicon.

19. The ROM of claim 11, wherein the plurality of bit lines comprise metal.

\* \* \* \* \*